United States Patent [19]

Watanabe

[11] Patent Number: 4,571,707
[45] Date of Patent: Feb. 18, 1986

[54] MEMORY CIRCUIT WITH IMPROVED REDUNDANT STRUCTURE

[75] Inventor: Takayuki Watanabe, Tokyo, Japan
[73] Assignee: NEC Corporation, Tokyo, Japan
[21] Appl. No.: 582,649
[22] Filed: Feb. 23, 1984
[51] Int. Cl.$^4$ ............................................. G11C 11/40
[52] U.S. Cl. ..................................... 365/200; 365/189
[58] Field of Search ......................... 365/200, 189, 230

[56] References Cited

U.S. PATENT DOCUMENTS

| | | | |
|---|---|---|---|
| 4,233,674 | 11/1980 | Russell et al. | 365/200 |
| 4,464,736 | 8/1984 | Smith | 365/200 |
| 4,523,313 | 6/1985 | Nibby et al. | 365/200 |

*Primary Examiner*—Terrell W. Fears
*Attorney, Agent, or Firm*—Sughrue, Mion, Zinn, Macpeak and Seas

[57] ABSTRACT

A memory circuit having an improved redundant structure which can operate with low power consumption. A plurality of program cells to store information identifying faulty memory cells. Each of the program cells is composed of a first series circuit of a program element and a first transistor of a first conductivity and a second series circuit of a second transistor of a second conductivity type and a third transistor of the first conductivity type, gates of the second and third transistors being connected to an intermediate junction of the first series circuit and a gate of the first transistor being connected to an intermediate junction of the second series circuit.

9 Claims, 3 Drawing Figures

MEMORY CIRCUIT WITH IMPROVED REDUNDANT STRUCTURE

BACKGROUND OF THE INVENTION

The present invention relates to a memory circuit, and more particularly to a memory having a redundant structure. The memory capacity of semiconductor memories has been increased to the point where memories having a 256k-bit capacity have become commercially available. However, the increase in the memory capacity has resulted in low fabrication yields due to the low probability of all circuit elements on such a dense structure being fabricated without defect. Hence, it has become difficult to obtain a memory in which all the constituent elements are good.

To reduce the above problem, memories having redundant structures have been developed and are widely utilized. In a memory having a redundant structure, a redundant array of memory cells is provided in addition to a normal array of memory cells. If a cell or cells in the normal array are faulty or defective, such defective cells are replaced by good cells in the redundant array, so that a functionally good memory can be obtained even though defects may be present in the normal array. Information as to the address of the replaced cells is stored by a program circuit which includes a plurality of programmable read only memory cells. When the defective cell in the normal array is addressed from the outside, the program circuit operates to inhibit accessing of the defective cell and to cause accessing of replacement cell or cells in the redundant array. Therefore, as viewed from outside the memory, it appears as if all cells in a normal array are accessable and free of defects.

Each of the programmable read only memory cells in the program circuit is formed of a fusible link and at least one transistor serially connected between power supply terminals. The cells are programmed by selectively cutting the fusible link by a trimming technique. As a result, some of the fusible links are cut while others remain uncut, according to the desired programmed state. However, according to this prior art technique, a DC current inevitably flows through the read only program cell when the fusible link remains uncut. Accordingly, relatively large power consumption results.

SUMMARY OF THE INVENTION

It is an object of the present invention to provide a memory circuit of the type having a redundant array of memory cells and which can operate at low power consumption.

A memory circuit according to the present invention comprises a normal memory cell array, a redundant memory cell array for replacing a faulty memory cell or cells in the normal memory array, and a program circuit for accessing non-defective cells in the redundant array when an external address, designating defective cells in the normal array, is received by the memory. The program circuit includes a plurality of programmable read only memory cells each having a first series circuit of a program element and a first insulated gate field effect transistor of a first conductivity type coupled between first and second potential terminals, and a second series circuit of a second insulated gate field effect transistor of a second opposite conductivity type and a third insulated gate field effect transistor of the first conductivity type coupled between the first and second potential terminals. The gates of the second and third field effect transistors are connected to an intermediate junction of the first series circuit, and a gate of the first field effect transistor is connected to an intermediate junction of the second series circuit. An output of the programmed state is derived from either the intermediate junction of the first series circuit or the intermediate junction of the second series circuit.

According to the present invention, the conductivity types of the second and third transistors of the second series circuit are different from each other, and hence both of the second and third transistors never conduct at the same time. Therefore, there is not DC current flowing through the second series circuit. The gate of the first transistor is supplied with a signal from the intermediate junction of the second series circuit, and hence when the program element such as a fusible link remains uncut the first transistor is always in the non-conducting state. Accordingly, no DC current flows through the first series circuit. Thus, a DC current flowing through the programmable memory can be effectively avoided.

DETAILED DESCRIPTION OF THE INVENTION

Figure 1:
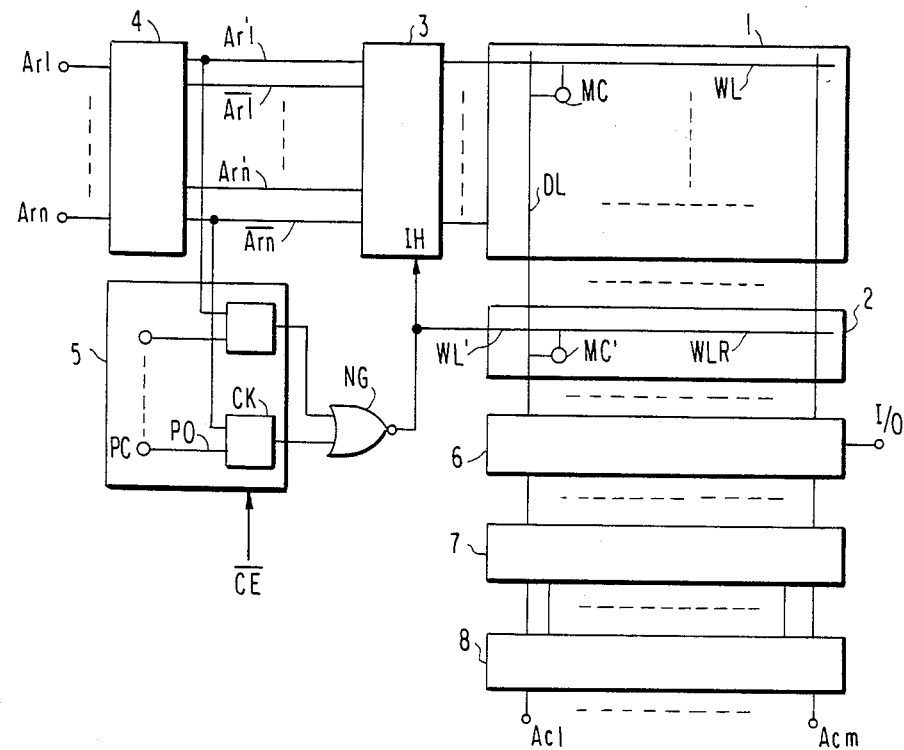
FIG. 1 is a block diagram showing a memory circuit according to the prior art.
Figure 2:
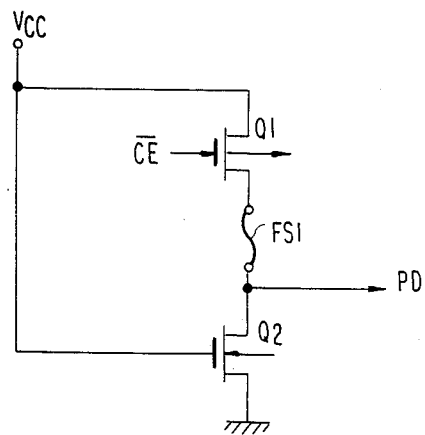
FIG. 2 is a circuit diagram of a programmable memory circuit employed in the memory of FIG. 1.

With reference to FIGS. 1 and 2, a memory circuit according to the prior art will be described. A normal array 1 includes a plurality of memory cells MC arranged at intersections of word lines WL and digit lines DL. A redundant array 2 includes a plurality of memory cells MC' arranged at intersections of a redundant word line WL' and the digit lines DL. An address inverter buffer 4 receives a plurality bits of row address signals Ar1 to Arn and generates their true and complementary signals (Ar1, $\overline{Ar1}$) to Arn', $\overline{Arn}$). A row decoder 3 operatively selects one of the word lines WL in response to the true and complementary address signals from the address inverter buffer 4. A column address inverter buffer 8 receives a plurality of column address signals Ac1 to Acm and generates their true and complementary signals, which are applied to a column decoder 7. A column selection circuit 6 operates to select one of the digit lines DL to be outputted at an input-/output terminal I/O in response to an output state of the column decoder 7. Under normal operating conditions, for example, an 8-bit word address identifying word line WLi causes decoder 3 to activate word line WLi thereby accessing all cells in that word line. The selection of one or more of the cells in the selected word line is caused by the column addressing components 6, 7 and 8.

In accordance with the simplified example shown in FIG. 1, the memory has the capability for substituting a redundant word line in the redundant array 2 for a word line in the normal array 1. Although substitution of only one word line is possible with the structure illustrated it will be apparent that substitution of multiple word lines is possible by extending the redundant array and the address control circuit 5.

The address control circuit 5 includes a PROM and a selection circuit. Following testing of the memory, information, such as an address, designating a word line WLx having a defective cell therein is programmed into the PROM. Thereafter, whenever the address applied to address inverter buffer 4 designates WLx, the address control circuit 5 detects this condition and outputs a signal which inhibits decoder 3 from accessing WLx while accessing the word line WLR in the redundant array.

The address control circuit 5 includes a plurality of programmable read only memory cells PC which are programmed to store an address of the word line WLx having a defective memory cell. When the word line WLx connected to the faulty memory cell is addressed from the outside, the states of the respective row address signals at that time are detected by comparator circuits CK and a NOR gate NG, which select the redundant word line WLR in the redundant array 2, while inhibiting the selection of the word line WLx connected to the faulty memory cell. As a result, when the word line connected to the faulty memory cell is addressed, the redundant array is automatically accessed in place of the faulty memory cell by the address control circuit 5.

An example of the programmable read only memory (PROM) cells PC employed in the address control circuit 5 is illustrated in FIG. 2. Each of the PROM cells PC is composed of a P-channel insulated gate field effect transistor (hereinafter abbreviated as IGFET) $Q_1$ and a fusible link FS1 formed of a polycrystalline silicon which are coupled in series between a power voltage terminal Vcc and a memory output line PO. The cell PC also includes an N-channel IGFET $Q_2$ coupled between the memory output line PO and ground potential. A gate of the IGFET $Q_1$ receives a chip enable signal $\overline{CE}$ which takes a high level (Vcc) when the memory is not accessed and a low level (GND) when the memory is accessed. The logic state of the cell is determined by whether or not the fusible link FS1 has been cut. The on-resistance of the IGFET $Q_1$ is selected lower than that of the IGFET $Q_2$ so that the potential at the output line is at a high level near the level Vcc, provided the fusible link FS1 has not been cut. If the fusible link FS1 was cut, the potential at the output line PO is at the ground potential by the conducting IGFET $Q_2$.

When the cell is in the state determined by the fusible link being uncut, a DC current will flow through the IGFET $Q_1$, the fusible link FS1 and the IGFET $Q_2$, resulting in large power consumption. In addition, this particular circuit requires that the IGFET $Q_1$ have low on-resistance as mentioned above, and hence the IGFET $Q_1$ must be fabricated with large dimensions.

Figure 3:
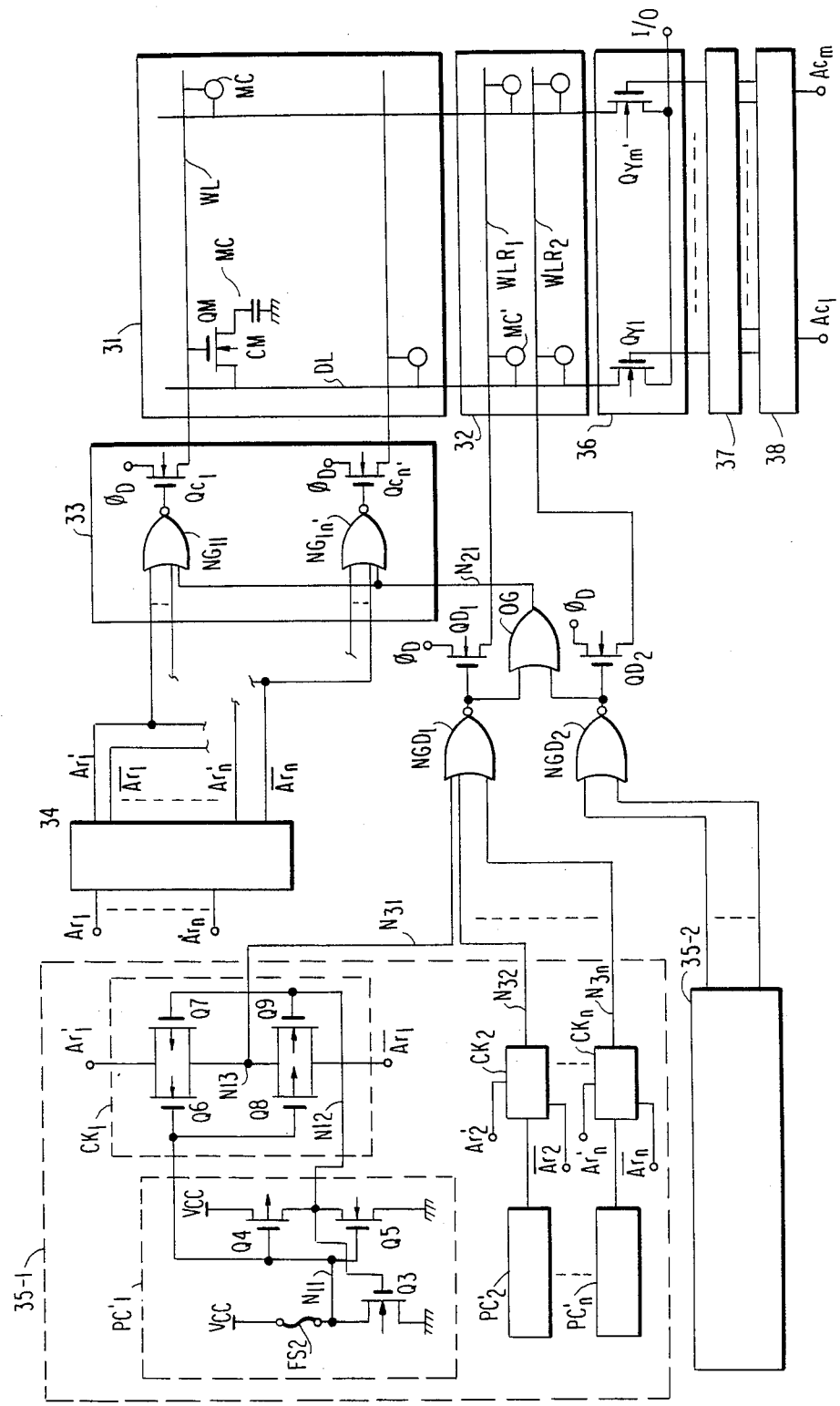
FIG. 3 is a circuit diagram showing an embodiment of the present invention.

With reference to FIG. 3, an embodiment of the present invention will be described. A normal array 31 includes a plurality of memory cells MC arranged at intersections of word lines WL and digit lines DL. Each of the memory cells MC is composed of an N-channel IGFET $Q_m$ and a storage capacitor CM. A redundant array 32 includes additional memory cells MC' arranged at intersections of redundant word lines WLR1 and WLR2 and the digit lines DL from the normal array 31. Although only two word lines are shown in the redundant array, it will be apparent that more can be provided. A row address inverter buffer 34 receives a plurality of row address signals Ar1 to Arn and generates their true and complementary signals (Ar1', $\overline{Ar1}$) to (Arn', $\overline{Arn}$). A row decoder 33 includes a plurality of NOR gates NG11 to NG1n' each selectively receiving the signals from the row address inverter buffer 34, and a plurality of word line driving transistors Qc1 to Qcn' each having a gate coupled to an output of the associated NOR gate, a drain supplied with a word line driving signal and a source coupled to the associated word line. A column address inverter buffer 38 receives a plurality of column address signals Ac1 to Acm and generates their true and complementary signals which are applied to a column decoder 37. A column selection circuit 36 includes a plurality of N-channel transfer IGFETs QY1 to QYm' each coupled between the associated one of the digit lines and an input/output terminal I/O. The transfer IGFETs are controlled by the column address decoder 37 to be selectively made conducting. In this embodiment, the additional memory cells coupled to two redundant word lines WLR1 and WLR2 and two address control circuits 35-1 and 35-2 are provided for translating faulty word addresses into redundant word address. The address control circuit 35-1 includes a PROM having a plurality of program cells PC'1 to PC'n provided in correspondence with the row address signals Ar1 to Arn. The cells PC' of control circuit 35-1 are programmed after testing so that the PROM of control circuit 35-1 will store information identifying the address of a word line $WL_{x1}$ which is connected to a defective cell or cells. The cells PC of control circuit 35-2 will similarly be programmed after testing to store information identifying another "defective" word line, $WL_{x2}$.

The address control circuit 35-1 also includes address comparator circuits $CK_1$ to $CK_n$ for comparing the information stored in the PROM with the externally generated word address. If the externally generated address is not the same as the one in the PROM, the address control circuit 35-1 will not alter the accessing operation of the memory. However, if the externally applied address is the same as that stored in the PROM, the outputs from the selection circuits $CK_1$ through $CK_n$ will cause a NOR gate NGD1 to turn on IGFET $Q_{D1}$ to access redundant word line WLR1. Also OR gate OG will provide an output to decoder 33 to inhibit its selection of a word line in the normal array. Address control circuit 35-2 works in the same manner.

The program cell PC'1 is composed of a first series circuit of a fusible link FS2 and an N-channel IGFET $Q_3$ coupled between a power voltage Vcc and a ground potential (GND), and a second series circuit of a P-channel IGFET $Q_4$ and an N-channel IGFET $Q_5$ coupled between the power voltage Vcc and GND. Gates of the IGFETs $Q_4$ and $Q_5$ are commonly connected to an intermediate junction $N_{11}$ while a gate of the IGFET $Q_3$ is connected to an intermediate junction $N_{12}$ of the second series circuit so that the IGFETs $Q_3$, $Q_4$ and $Q_5$ and the fusible link FS2 form a flipflop type programmable memory cell. Other cells PC'2 to PC'n have the same structure as the cell PC'1.

The address comparator CK1 receives both the true and complementary address signals Ar1' and $\overline{Ar1}$ and transmits one of them to NOR gate NGD1 depending on the programmed state of the cell PC'1. In the case where the fusible link FS2 of the cell PC'1 is cut, the signal $\overline{AR1}$ is outputted to an output line N31 through the IGFETs $Q_8$ and $Q_9$. In the case where the fusible link FS2 of the cell PC'1 has not been cut, the signal $\overline{AR1}'$ is outputted to the output line N14 through the IGFETs $Q_6$ and $Q_7$. Other address comparator circuits CK2 to CKn have a similar structure to the circuit CK1 and receive the true and complementary signals (Ar'2, $\overline{Ar2}$) to (Ar'n, $\overline{Arn}$), respectively. When the potential of all the lines $N_{31}$ to $N_{3n}$ are at the low level, the NOR gate NGD1 selects the redundant word line WLR1 via a drive IGFET $Q_{D1}$. Here, the timing of drive signal $\phi$ D is such that the signal rises to a high level after the state of the address signals are determined.

Each of the comparator circuits in the specific embodiment acts like a controlled inverter. For example if the stored address bit in PC'1 is a "0" the address bit $Ar_1'$ will pass to the output $N_{31}$. If the stored address bit is a "1", the address bit Ar1 will effectively be inverted; actually the complementary bit $\overline{Ar1}$ will be applied to the output $N_{31}$. Thus, only if the stored address and the external address are identical will all output lines be at the low or "0" level.

The fusible links FS2 in the program cells PC'1 to PC'n preferably are made of polycrystalline silicon. The links can be cut by laser trimming after testing of the arrays 31 and 32.

The operation of the program cells PC'1 to PC'n will now be explained in more detail. A resistance ($R_1$) of the fusible link FS2 is selected to be lower than the on-resistance ($R_2$) of the IGFET $Q_4$, while capacitance ($C_1$) of the junction $N_{11}$ and capacitance ($C_2$) of the junction $N_{12}$ are substantially the same. The following relation is thereby established.

$$R_1C_1 < R_2C_2.$$

When a voltage Vcc is applied to the PC, and assuming the link FS2 has not been cut, the potential at node $W_{11}$ will be at a higher level than that at node $N_{12}$. When the potential at node $N_{11}$ reaches the threshold voltage of $Q_5$ the latter turns on thereby dropping the potential at node $N_{12}$. This, in turn insures that $Q_3$ will be cut off. The stable state will consist of $Q_5$ being ON, and $Q_3$ and $Q_4$ being OFF. The $N_{12}$ output will be low and the $N_{11}$ output will be high. It will be apparent that in this state no DC current flows in the PC.

In the case where the fusible link FS2 has been cut, application of the power voltage Vcc will cause the potential at the node N12 to rise through the IGFET $Q_4$. When the potential at the node $N_{12}$ reaches the threshold voltage of the IGFET $Q_3$, then the latter turns ON and pulls the potential at the node $N_{11}$ down to ground potential. The IGFET $Q_5$ becomes non-conducting or OFF in response to the ground potential at the node $N_{11}$. In this state of the PC, the IGFETs $Q_3$ and $Q_4$ are ON while the IGFET $Q_5$ is OFF. Therefore, no DC current flows through the first series circuit (the cut fusible link and the IGFET $Q_3$) or through the second series circuit (the IGFETs $Q_4$ and $Q_5$).

In addition, the cell PC'1 is of so-called ratioless type, and hence the potential equal to the power voltage Vcc or equal to ground potential is directly generated at the node $N_{11}$ or $N_{12}$. Therefore, a high utilizing efficiency of the power voltage can be achieved.

As described above, according to the present invention, the program cells PC' to PC'n do not consume any DC current, and hence the memory circuit operable with low power consumption can be obtained.

Though the present invention has been explained in connection with a preferred embodiment, it should be apparent that the present invention is not limited to that embodiment.

I claim:

1. In a semiconductor memory of the type having a normal array of memory cells, means for accessing cells in said normal array in response to address information applied to said semiconductor memory, a redundant array of cells for substituting for faulty cells in said normal array, and an address control circuit responsive to said address information for causing said memory to access cells of said redundant array in substitution for cells in said normal array when said address information addresses faulty cells in said normal array, wherein said address control circuit comprises, a programmable read only memory (PROM) consisting of a plurality of PROM cells, each of said PROM cells having a first series circuit of a fusible link and a first field effect transistor of a first conductivity type for connection between a first voltage terminal and a second voltage terminal, a second series circuit of a second field effect transistor of a second conductivity type and a third field effect transistor of said first conductivity type for connection between said first voltage terminal and said second voltage terminal in series, means for connecting gates of said second and third transistors to an intermediate junction of said first series circuit, and means for connecting a gate of said first transistor to an intermediate junction of said second series circuit, whereby the connection-disconnection condition of said fusible member determines the state of information stored in said cell.

2. The invention according to claim 1, in which said fusible link is made of a polycrystalline silicon.

3. The invention according to claim 1 wherein said address control circuit further includes selection circuit means connected to said PROM and adapted to receive said address information for providing a first output when said address information corresponds to that stored within said PROM and a second output when said address information does not correspond to that stored in said PROM, and logic circuit means responsive to said first output for inhibiting access to said normal array and providing access to said redundant array.

4. The invention according to claim 3, wherein said selection circuit means comprises a plurality of selective address signal transfer circuits, one connected to each said PROM cell, respectively, each said transfer circuit adapted to receive the true and complement signals representing one bit of said address and providing at an output thereof one of said true and complement signals depending upon the state of the associated PROM cell; the output signals from all transfer circuits constituting the output of said selection circuit means.

5. The invention according to claim 4, in which each of said selective address signal transfer circuits includes a first parallel circuit of a fourth field effect transistor of said first conductivity type and a fifth field effect transistor of said second conductivity type coupled between a first terminal and an output terminal, a second parallel circuit of a sixth field effect transistor of said second conductivity type and a seventh field effect transistor of said first conductivity coupled between said output terminal and a third terminal, means for connecting gates of said fourth and sixth transistor to the intermediate junction of the first series circuit of the associated programmable read only memory cell, means for connecting gates of said fifth and seventh transistors to the intermediate junction of the second series circuit of said associated programmable read only memory cell, means for supplying said first terminal with one of the true and complementary signals of the associated address signal, and means for supplying said second terminal with the other of said true and complementary signals of said associated address signal.

6. A memory circuit comprising a first array of memory cells arrayed in rows and columns, a second array of memory cells arrayed in rows and columns, a row address inverter buffer receiving a plurality of row address signals to generate their true and complementary signals, a first row decoder responsive to said true and complementary signals for selecting one of the rows of said first array, a second row decoder for operatively selecting one of the rows of said second array, a plurality of program cells for storing information representing at least one row of said first array to be replaced by a row of said second array, each of said program cells including a first series circuit of a programming element and a first field effect transistor of a first conductivity type coupled between first and second voltage terminal, a second series circuit of a second field effect transistor of a second conductivity type and a third field effect transistor of said first conductivity type coupled between said first and second voltage terminals, means for connecting gates of said second and third transistors to an intermediate junction of said first series circuit, and means for connecting a gate of said first transistor to an intermediate junction of said second transistor, and a control circuit responsive to states of said program cells and said row address signals for enabling said second row decoder and inhibiting said first row decoder when the input row address signal defines a row corresponding to that represented by the stored information in said program cells.

7. A semiconductor circuit comprising a first series circuit of a fusible link having a resistance of a first value and a first field effect transistor of a first conductivity type for connection between a first voltage terminal and a second voltage terminal, a second series circuit of a second field effect transistor of a second conductivity type having an on-resistance of a second value larger than said first value and a third field effect transistor of said first conductivity type for connection between said first voltage terminal and said second voltage terminal in series, means for connecting gates of said second and third transistors to an intermediate junction of said first series circuit, means for connecting a gate of said first transistor to an intermediate junction of said second series circuit, and means for deriving an output signal from at least one of said intermediate junctions of said first and second series circuits.

8. The circuit according to claim 7, in which said fusible link is made of a polycrystalline silicon.

9. The circuit according to claim 7, further comprising a first parallel circuit of a fourth field effect transistor of said first conductivity type and fifth field effect transistor of said second conductivity type, a second parallel circuit of a sixth field effect transistor of said first conductivity type and seventh field effect transistor of said second conductivity type, means for connecting one of said intermediate junctions of said first and second series circuits to the gates of said fourth and seventh transistors, means for connecting the other of said intermediate junctions to the gates of said fifth and sixth transistors, means for applying a first signal to one end of said first parallel circuit, means for applying a second signal to one end of said second parallel circuit, and an output terminal connecting to the other ends of said first and second parallel circuits.

* * * * *